United States Patent [19]

Ishikawa

[11] Patent Number: 4,544,897
[45] Date of Patent: Oct. 1, 1985

[54] CRYSTAL OSCILLATOR CIRCUIT WITH FEEDBACK CONTROL

[75] Inventor: Nobuyuki Ishikawa, Kanagawa, Japan

[73] Assignee: Sony Corporation, Tokyo, Japan

[21] Appl. No.: 556,190

[22] Filed: Nov. 29, 1983

[30] Foreign Application Priority Data

Nov. 30, 1982 [JP] Japan ................ 57-209875

[51] Int. Cl.$^4$ ............................................. H03B 5/30
[52] U.S. Cl. ................ 331/116 R; 331/109; 331/183
[58] Field of Search ............ 331/109, 116 R, 116 FE, 331/158, 159, 183

[56] References Cited

U.S. PATENT DOCUMENTS

| 3,321,715 | 5/1967 | Bloch | 331/109 |
| 3,324,415 | 6/1967 | Sheffet | 331/109 X |
| 4,193,046 | 3/1980 | Chiba | 331/109 |
| 4,358,742 | 11/1982 | Ferriss | 331/158 |

*Primary Examiner*—Eugene R. LaRoche
*Assistant Examiner*—Robert J. Pascal
*Attorney, Agent, or Firm*—Lewis H. Eslinger; Alvin Sinderbrand

[57] ABSTRACT

An oscillating circuit includes first and second stage amplifiers, a feedback circuit formed of a capacitor and a resistor and connected between the output terminal of the second stage amplifier and the input terminal of the first stage amplifier and a crystal resonator having a predetermined resonance frequency and being connected to the first stage amplifier, the total gain of the oscillating circuit being selected so that the oscillating circuit initiates its oscillation only when the crystal resonator is connected to the first stage amplifier.

3 Claims, 8 Drawing Figures

FIG. 1
(PRIOR ART)
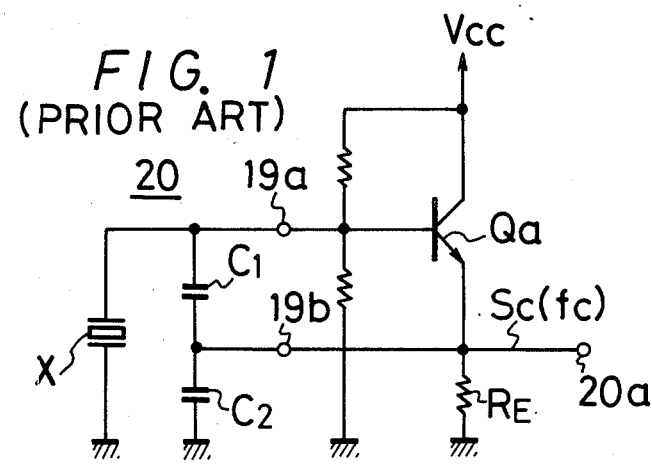
FIG. 2
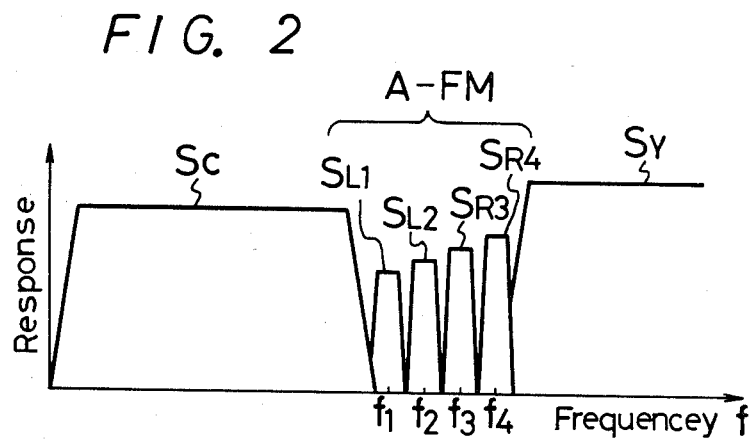
FIG. 3

CRYSTAL OSCILLATOR CIRCUIT WITH FEEDBACK CONTROL

BACKGROUND OF THE INVENTION

1. Field of the Invention

This invention generally relates to an oscillating circuit and more particularly is directed to an oscillating circuit suitable for use in a frequency converter for converting or changing the center frequency of a frequency modulated signal.

2. Description of the Prior Art

An oscillator for providing a single signal used in, for example, a frequency converter circuit, is generally in the form of a Colpitts oscillator which employs a quartz oscillator as shown in FIG. 1.

FIG. 1, reference letter Qa represents an amplifying transistor, $C_1$ and $C_2$ are capacitors for determining a feedback capacity and X is a quartz vibrator or crystal resonator.

When the single signal to be used in the above mentioned signal converter circuit contains a higher harmonic component of other than the fundamental frequency, that component becomes spurious and affects the signal converter system. Therefore, it is desired that the single signal be limited to a single mode as much as possible.

However, since a Colpitts oscillator such as is shown in FIG. 1 at 20 contains a signal component of high-order mode, it is difficult to produce a desired single signal component. Also, when the oscillating or resonance frequency $f_c$ is relatively low, the capacities of the capacitors $C_1$ and $C_2$ become relatively large. As a result, when the Colpitts oscillator 20 is formed as an IC (integrated circuit), it is necessary for the capacitors $C_1$ and $C_2$ to be externally connected thereto. Therefore, in that case, at least two external terminals 19a and 19b are required.

Further, in order to reduce as much as possible the distortion of the single signal Sc which is the oscillating output, it is necessary to accurately adjust the feedback capacities of the capacitors $C_1$ and $C_2$. This adjustment is quite troublesome. Furthermore if in order to obtain a constant feedback capacity, a resistor $R_E$ connected to the emitter of the transistor Qa is controlled in response to the output of the single signal Sc obtained at an output terminal 20a, the resistor $R_E$ can not be controlled without difficulty if the circuit is formed as an IC.

Therefore, with the conventional circuitry shown in FIG. 1, it is impossible to easily obtain an oscillating output having low distortion.

OBJECTS AND SUMMARY OF THE INVENTION

Accordingly, it is an object of the present invention to provide an improved oscillating circuit.

It is another object of the present invention to provide an oscillating circuit which can produce a stable oscillating output having a low distortion.

It is still another object of the present invention to provide an oscillating circuit which is suitable for being formed as an integrated circuit.

It is a further object of the present invention to provide an oscillating circuit which is suitable for use as an oscillator in a signal converting circuit.

According to an aspect of the present invention, an oscillating circuit comprises a first stage amplifier having an input terminal and an output terminal;

a second stage amplifier having an input terminal connected to said output terminal of said first stage amplifier and an output terminal;

a feedback circuit connected between the output terminal of said second stage amplifier and the input terminal of said first stage amplifier and including a series circuit of a capacitor and a resistor;

an crystal resonator having a resonance frequency determined by a mechanical property of a crystal and connected to said first stage amplifier; and means for determining the total gain of the circuit such that the oscillating condition is satisfied at a frequency near said resonance frequency of said crystal resonator including a gain control circuit detecting an output signal from the second stage amplifier and comparing the detected output signal with a reference signal for controlling the gain of the second stage amplifier in accordance with the comparison.

The above, and other objects, features and advantages of the present invention will become apparent from the following description taken in conjunction with the accompanying drawings through which the like references designate the same elements and parts.

BRIEF DESCRIPTION OF THE DRAWINGS

FIG. 1 is a connection diagram showing an example of a known oscillator;

FIG. 2 is an audio and video frequency spectrum diagram of a recording and reproducing system to which the present invention may be advantageously applied;

FIG. 3 is a diagram showing a track pattern employed in the recording and reproducing system;

DESCRIPTION OF THE PREFERRED EMBODIMENT

Prior to describing the present invention, a technical field to which the present invention is suitable for being applied will be described hereinafter.

In a VTR (video tape recorder) of, for example, the helical scan type, the rate of magnetic tape consumption can be greatly reduced by employing high density recording. On the other hand, as the rate of tape consumption is reduced, the running speed of the magnetic tape becomes as slow as approximately 1.33 cm/sec. As a result, since the relative speed between a stationary or fixed head for recording an audio signal and the magnetic tape becomes slow, the quality of the audio signal to be recorded is inevitably lowered and hence high-fidelity sound can not be enjoyed.

Therefore, it is proposed to employ a recording and/or reproducing system in which the audio signal is frequency modulated (FM-modulated), recorded together with a video signal by a rotary magnetic head and then reproduced by a rotary head to thereby improve the tone quality.

When this new recording and/or reproducing system is applied to a low frequency band conversion FM (frequency modulation) recording system (M system), as shown in FIG. 2, an FM-modulated audio signal A-FM is frequency-multiplexed between the frequency bands of a low frequency band-converted carrier chrominance signal Sc and a frequency-modulated luminance signal $S_Y$.

In this example, left and right audio signals $S_L$ and $S_R$ are separated from each other and FM-modulated respectively, while in order to reduce zero beat noise caused by crosstalk components between adjacent channels, the carrier frequencies of the FM audio signals to be recorded in the adjoining channels are selected not to be coincident with each other.

For example, in the left audio signal $S_L$, the carrier frequencies $f_1$ and $f_2$ ($f_2 = f_1 + f_c$ where $f_c$ represents the frequency of, for example, 150 kHz) are FM-modulated, while in the right audio signal $S_R$, the carrier frequencies $f_3$ and $f_4$ ($f_3 = f_2 + f_c$ and $f_4 = f_3 + f_c$) are FM-modulated. Then, as shown in FIG. 3, on a certain track To are recorded left and right FM audio signals $S_{L1}$ and $S_{R3}$ having the carrier frequencies $f_1$ and $f_3$, while on a succeeding track Te are recorded left and right FM audio signals $S_{L2}$ and $S_{R4}$ having the carrier frequencies $f_2$ and $f_4$.

Figure 4:
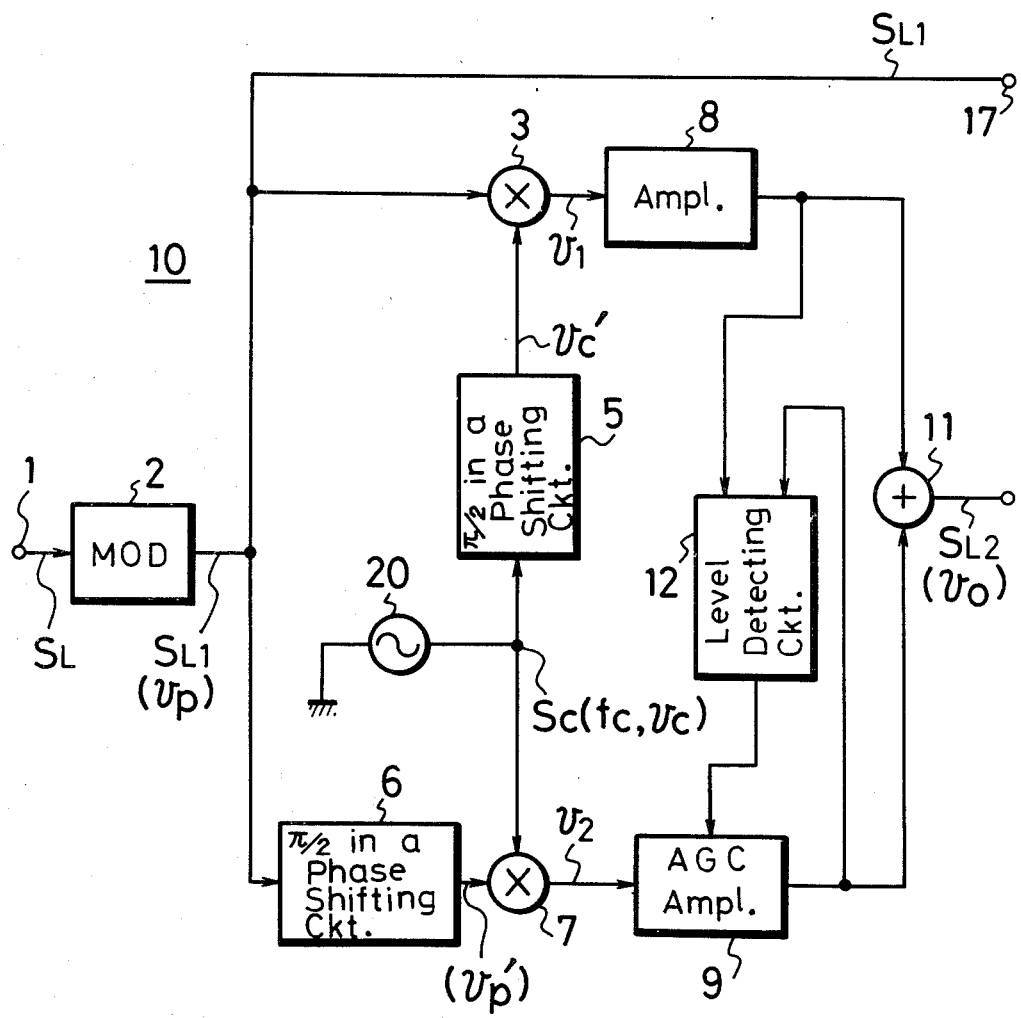
FIG. 4 is a systematic block diagram showing an example of a signal converting circuit in which an oscillator is used.

FIG. 4 shows an example of a signal converting circuit 10 which produces the FM audio signals $S_{L1}$ and $S_{L2}$ and to which the present invention is applicable. In FIG. 4, the FM audio signals $S_{L1}$ and $S_{L2}$ are formed by a heterodyne system which forms the carrier frequency $f_2$ from the carrier frequency $f_1$. Similarly, the carrier frequency $f_4$ may be formed from the carrier frequency $f_3$ by a heterodyne system. FIG. 4 shows a practical example in which the FM audio signals $S_{L1}$ and $S_{L2}$ are formed.

In FIG. 4, the left audio signal $S_L$ supplied to a terminal 1 is FM-modulated by an FM modulator 2 to be the FM audio signal $S_{L1}$ having $f_1$ as its carrier frequency, which is then supplied to a first mixer (in this example, the balanced modulator) 3.

Reference numeral 20 designates an oscillator or oscillating circuit which oscillates at the frequency $f_c$. The single signal Sc provided as the oscillating output from the oscillator 20 is shifted in phase by $\pi/2$ in a phase shifting circuit 5 and then supplied to the first mixer 3.

The FM audio signal $S_{L1}$ is further shifted in phase by $\pi/2$ in a phase shifting circuit 6 and then supplied to a second mixer 7 to which the single signal Sc is supplied as it is. The output from the first mixer 3 is supplied through an amplifier 8 to one input of a composer or adder 11 and the output from the second mixer 7 is supplied through an AGC (automatic gain control) amplifier 9 to another input of the composer 11. Reference numeral 12 designates a level detecting circuit which generates an AGC voltage. In this example, the AGC amplifier 9 is controlled by the level detecting circuit 12 in such a manner that the level of the output from the second mixer 7 is made coincident with that of the output from the first mixer 3.

The operation of the signal converting circuit 10 will now be described. For the sake of convenience, it will be assumed that the FM audio signal $S_{L1}$ without modulation is being processed. It will further be assumed that the signal voltages indicated in FIG. 4 are at that time (that is, when $S_{L1}$ is without modulation) as follows:

When $$vp = A \cos \omega_1 t \qquad (1)$$

$$\begin{cases} A: \text{amplitude} \\ \omega_1 = 2\pi f_1 \\ f_1 = \text{carrier frequency} \end{cases}$$

$$vc = A' \cos \omega_c t \qquad (2)$$

$$\begin{cases} A': \text{amplitude} \\ \omega_c = 2\pi f_c \\ f_c: \text{single frequency} \end{cases}$$

thus $$vp' = A \cos(\omega_1 t + \pi/2) = A \sin \omega_1 t \qquad (3)$$
$$vc' = A \cos(\omega_c t + \pi/2) = A' \sin \omega_c t \qquad (4)$$
$$\therefore v_1 = vp \cdot vc' \qquad (5)$$
$$= K_1 \cos \omega_1 t \cdot \sin \omega_c t \; (K_1 = A \cdot A')$$

$$= \frac{K_1}{2} \{\sin(\omega_1 + \omega_c)t - \sin(\omega_1 - \omega_c)t\}$$

and also $$v_2 = vp' \cdot vc \qquad (6)$$
$$= K_2 \sin \omega_1 t \cdot \cos \omega_c t \; (K_2 = A \cdot A')$$

$$= \frac{K_2}{2} \{\sin(\omega_1 + \omega_c)t + \sin(\omega_1 - \omega_c)t\}$$

If $$K_1 = K_2,$$

thus, $$v_0 = v_1 + v_2 \qquad (7)$$
$$= K \sin(\omega_1 + \omega_c)t$$
$$K = K_1 = K_2$$

When the mixing of the frequencies is carried out as described above, and as shown by the equations (5) and (6), there are generated first and second converter outputs (upper and lower side band components) which are respectively frequency-converted to higher and lower sides as $f_1 + f_c$ and $f_1 - f_c$ with the carrier frequency $f_1$ as the center. If the phases of the signals inputted to the first and second mixers 3 and 7 are properly determined and the AGC amplifier 9 is controlled in such a manner that the levels $K_1$ and $K_2$ of the outputs $v_1$ and $v_2$ from the first and second mixers 3 and 7 become equal to each other, the converted output which is frequency-converted to the side higher by $F_c$ than the carrier frequency $f_1$, namely, the FM audio signal $S_{L2}$ can be obtained by only adding the first mixer output $v_1$ and the second mixer output $v_2$ to each other.

The above relation can be similarly established for the case in which the FM audio signal $S_{R3}$ FM-modulated by the audio signal $S_R$ is frequency-converted to obtain the converted output having the frequency higher by $f_c$ than the carrier frequency $f_3$, namely, the FM audio signal $S_{R4}$.

When the FM audio signal $S_{R4}$ is frequency-converted to provide a converted output having a frequency lower by $f_c$ than the carrier frequency $f_4$, namely, the FM audio signal $S_{R3}$, it may be sufficient that a subtracter is used in place of the adder 11 to subtract the first mixer output $v_1$ from the second mixer output $v_2$.

Also in the reproducing system, the same signal converting circuit is employed.

Now, an embodiment of the oscillating circuit according to the present invention which is usable as the oscillator 20 in the signal converting circuit 10 shown in FIG. 4 will hereinafter be described in detail with reference to FIG. 5.

The oscillating circuit 20 is shown to include a first stage amplifier 21A and a second or last stage amplifier 21B. The single signal Sc which is an output signal obtained at an output terminal 20a of the circuit 20 is fed back to the first stage amplifier 21A through a feedback circuit 22 which consists of a series connection of a capacitor Ca and a resistor Ra and a parallel connection of a capacitor Cb and a resistor Rb.

The resonance frequency of this feedback circuit 22 is selected to be the same as, or near the oscillating or resonance frequency $f_c$ of a crystal resonator X.

In accordance with the present invention, the crystal resonator X is connected to the first stage amplifier 21A and the various elements are selected so as to make the total gain of the whole system the gain required for the oscillating condition. Therefore, the total gain provided when the crystal resonator X is not connected to the first stage amplifier 21A can not satisfy the oscillating condition.

Reference numeral 23 designates an AGC control circuit and by the output therefrom, the gain of the last stage amplifier 21B is controlled so that at the output terminal 20a appears the single signal Sc the gain of which is always constant.

Figure 6A:
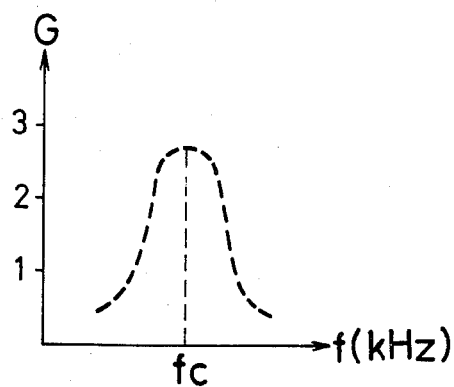
FIGS. 6A and 6B are graphs to which reference will be made in explaining the operation of the oscillating circuit shown in FIG. 5.

If the crystal resonator X is not connected to the amplifier 21A, the oscillating circuit 20 becomes the same in construction as a Wien bridge type oscillator. Thus, the total gain thereof when the crystal resonator X is not connected to be amplifier 21A (the total gain after the AGC control is carried out) is selected to be slightly smaller than the critical gain which ensures the oscillating condition. An example of the gain characteristic for the condition in which the critical gain is "3" and the crystal resonator X is not provided is represented by the curve of FIG. 6A.

Figure 6B:
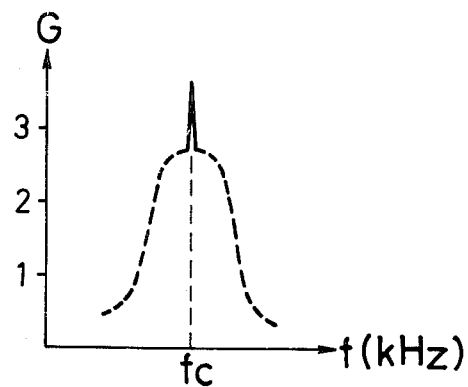

On the contrary, when the crystal resonator X having the resonance frequency of $F_c$ is connected to the amplifier 21A, the elements of the oscillating circuit 20 are selected such that its total gain becomes larger than the critical gain thereof. As a result, only when the crystal resonator X is connected to the amplifier 21A, does the oscillating circuit 20 carries out its oscillating operation. The gain characteristic at that time is shown in the graph of FIG. 6B.

As is well known, a CR type oscillator formed of a capacitor and a resistor is generally poor in stability, while an oscillator employing a crystal resonator is significantly high in stability. In the crystal resonator, however, frequency components of high order are provided in addition to the fundamental or resonance frequency $f_c$. There is then a defect that the oscillating output therefrom is distorted.

However, if there is provided the feedback circuit 22 as in the present invention, the frequency component of the high order is suppressed by the feedback circuit 22 and also the oscillating circuit 20 is made to oscillate only at the fundamental frequency $f_c$ so that distortion components of the oscillating output are sufficiently suppressed.

In order to further reduce the high-order frequency component, it is preferred that the oscillating circuit 20 be operated in the oscillating critical state. However, if the oscillating circuit 20 is operated in its critical state, there is a danger that its oscillating operation may become extremely unstable.

Therefore, according to the present invention, the AGC system is provided to control the gain of the last stage amplifier 21B, namely, to perform the AGC operation in such a manner that the total gain of the oscillating circuit 20 is always a little larger than the oscillating critical gain. Thus, the oscillating circuit 20 oscillates in substantially the fundamental mode so that the frequency components of high order can be greatly suppressed as compared with the prior art. Since the range of the AGC is equal to the fluctuation range of the total gain when the crystal resonator X is connected to the first stage amplifier 21A, such AGC range is quite narrow and hence it is easy to provide the AGC.

Figure 7:
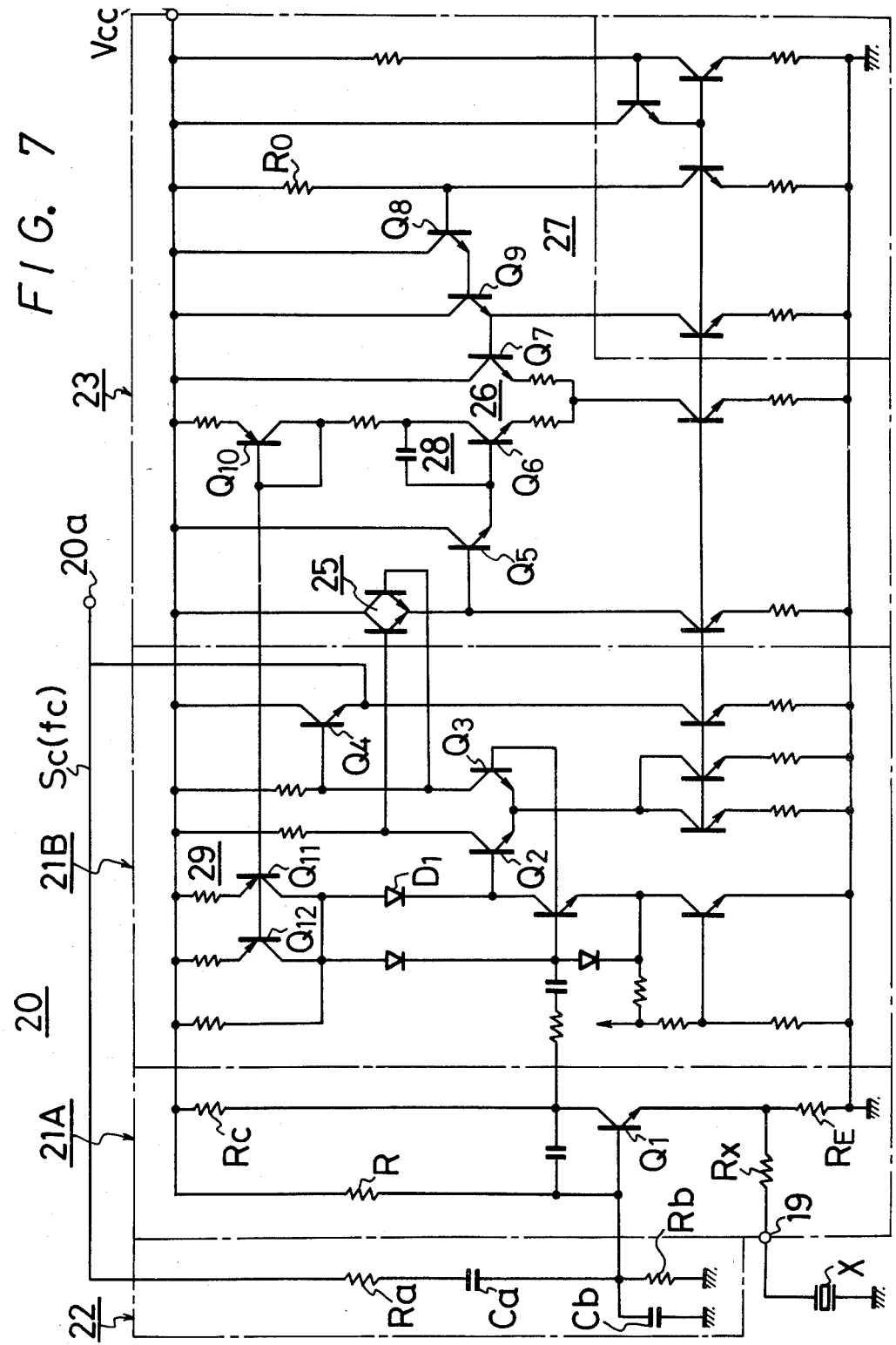
FIG. 7 is a connection diagram showing a practical example of the oscillating circuit shown in FIG. 5.

FIG. 7 is a connection diagram showing a practical example of the above oscillating circuit 20. In FIG. 7, the amplifier 21A includes an amplifying transistor $Q_1$ and the gain of the amplifier 21A is substantially determined by a resistance ratio between a collector resistor Rc and an emitter resistor $R_E$ of the transistor $Q_1$. As shown in FIG. 7, the crystal resonator X is connected through a resistor Rx to the emitter of the transistor $Q_1$.

The last or second stage amplifier 21B, namely, the AGC amplifier 21B, comprises a differential amplifier which consists of a pair of transistors $Q_2$ and $Q_3$ as shown in the figure. The output terminal 20a is led out from the collector of the transistor $Q_3$ through an emitter-follower transistor $Q_4$. The output from the differential amplifier is fully rectified by a full-wave rectifying circuit 25 formed of a pair of transistors and located in an AGC control voltage generating circuit 23 and then supplied through an emitter-follower transistor $Q_5$ to a comparing circuit 26.

The comparing circuit 26 is formed of a differential amplifier which consists of a pair of transistors $Q_6$ and $Q_7$. A reference voltage is applied to one transistor $Q_7$. To this end, a power source voltage reduced through a resistor Ro is further reduced by a pair of transistors $Q_8$ and $Q_9$, prior to being supplied to the transistor $Q_7$ as the reference voltage. Reference numeral 27 designates a current source.

The other transistor $Q_6$ of the comparing circuit 26 is provided with a mirror integrating circuit 28 the output of which is supplied through a current mirror circuit 29 formed of transistors $Q_{10}$ to $Q_{12}$ and a voltage converting diode $D_1$ to the transistor $Q_2$ forming the differential amplifier.

The gain G at the first stage amplifier 21A is calculated by $$G = Rc/R_E$$

This caclulated gain is the gain for the case where the crystal resonator X is not connected to the amplifier 21A.

On the other hand, when the crystal resonator X is connected to the amplifier 21A, the gain Gx is calculated as $$Gx = \frac{Rc}{R_E // Rx}$$

Where Rc, $R_E$ and Rx are resistance values of the resistors Rc, $R_E$ and Rx.

Since Gx>G, the resistance values Rc, $R_E$ and Rx are selected to satisfy the condition of Gx≧3.

When the above-described circuitry according to the invention is formed as an IC, only one terminal pin 19 (see FIG. 7) is necessary as an external terminal pin for the connection of the crystal resonator X, so that the number of the terminal pins can be reduced as compared with the case shown in FIG. 1.

Although the above-described oscillating circuit according to the present invention is applied to the oscillator of a signal converting circuit used in a magnetic recording and reproducing apparatus, it is needless to say that the oscillating circuit of the present invention can be applied to an oscillator in other types of magnetic recording and reproducing apparatus and other electronic devices with the same effect.

Figure 5:
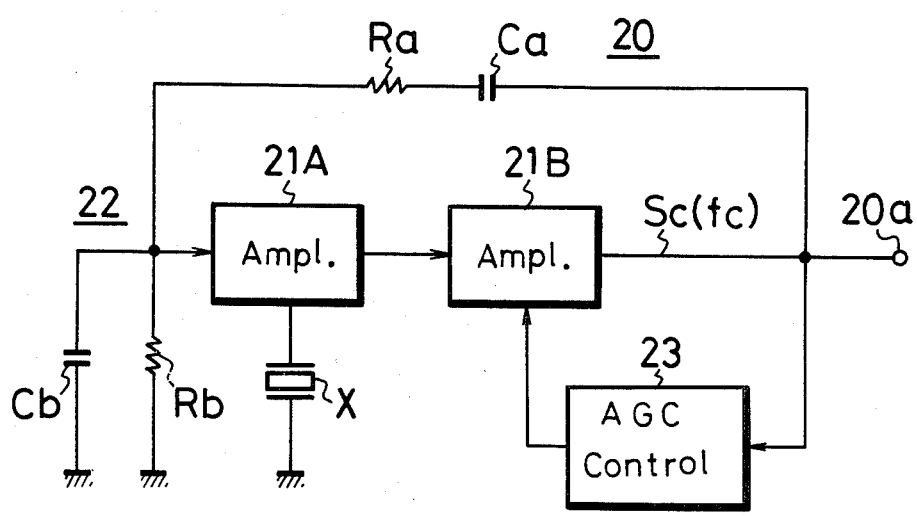
FIG. 5 is a schematic diagram shown an embodiment of an oscillating circuit according to the present invention.

Although, in the embodiment shown in FIG. 5 the G≈3 is exemplified as the oscillating critical gain of the oscillator, other values are also possible. Furthermore, the constants of the capacitors Ca and Cb and the resistors Ra and Rb are selected so that, when the crystal resonator X is disconnected from amplifier 21A, the oscillating frequency of the oscillating circuit 20 becomes equal to or near the fundamental frequency $f_c$. Even if these values are a little scattered, the oscillating circuit 20 does not oscillate at a frequency other than the resonance frequency $f_c$ determined by the crystal resonator X. Therefore, even if the constants vary from the selected values, it is not necessary to correct the constants.

As set forth above, according to the present invention, it is possible to provide an oscillating circuit which is relatively simple in arrangement, excellent in stability, low in distortion and suitable for being formed as an IC. Thus, the oscillating circuit according to the present invention is particularly suitable for being used as the oscillating circuit in the signal converting circuit and the like which are required to produce a highly stable and low distortion oscillating output.

Although a preferred embodiment of the invention has been described above, it will be apparent that many modifications and variations could be effected by one skilled in the art without departing from the spirit or scope of the invention as defined by the appended claims.

I claim as my invention:

1. Oscillating circuit comprising:
   a first stage amplifier having an input terminal and an output terminal;
   a second stage amplifier having an input terminal connected to said output terminal of said first stage amplifier and an output terminal;
   a feedback circuit connected between the output terminal of said second stage amplifier and the input terminal of said first stage amplifier and including a series circuit of a capacitor and a resistor;
   a crystal resonator having a resonance frequency determined by a mechanical property of a crystal and connected to said first stage amplifier; and
   means for determining the total gain of the circuit such that the oscillating condition is satisfied at a frequency near said resonance frequency of said crystal resonator, said total gain determining means including a gain control circuit having a detector for detecting an output signal at the output terminal of said second stage amplifier and a comparator for comparing the output of said detector and a reference signal and correspondingly controlling the gain of said second stage amplifier.

2. Oscillating circuit according to claim 1, wherein said feedback circuit further includes a parallel circuit of a capacitor and a resistor connected between the input terminal of said first stage amplifier and ground.

3. Oscillating circuit according to claim 1, wherein said first stage amplifier includes a common emitter transistor and said crystal resonator is connected to the emitter of said common emitter transistor whereby the emitter impedance of said common emitter transistor is a minimum at the resonance frequency of said crystal resonator.

* * * * *